(12) United States Patent
Westphal

(10) Patent No.: US 7,225,415 B2
(45) Date of Patent: *May 29, 2007

(54) VECTOR LOGIC TECHNIQUES FOR MULTILEVEL MINIMIZATION WITH MULTIPLE OUTPUTS

(75) Inventor: Jonathan Westphal, Pocatello, ID (US)

(73) Assignee: Vectorlog, Inc., Pocatello, ID (US)

( * ) Notice: Subject to any disclaimer, the term of this patent is extended or adjusted under 35 U.S.C. 154(b) by 93 days.

This patent is subject to a terminal disclaimer.

(21) Appl. No.: 10/931,456

(22) Filed: Sep. 1, 2004

(65) Prior Publication Data

US 2005/0091617 A1    Apr. 28, 2005

Related U.S. Application Data

(63) Continuation-in-part of application No. 10/655,766, filed on Sep. 5, 2003, now Pat. No. 7,174,519.

(51) Int. Cl.
*G06F 17/50* (2006.01)

(52) U.S. Cl. .............................. 716/2; 716/3
(58) Field of Classification Search ............. 716/1–4, 716/18
See application file for complete search history.

(56) References Cited

U.S. PATENT DOCUMENTS 5,128,871 A * 7/1992 Schmitz ................. 716/17
5,493,504 A * 2/1996 Minato ................... 716/2
5,867,397 A * 2/1999 Koza et al. ............. 703/14
6,336,208 B1 * 1/2002 Mohan et al. .......... 716/16
6,499,129 B1 * 12/2002 Srinivasan et al. ...... 716/4
6,851,095 B1 * 2/2005 Srinivasan et al. ...... 716/4

OTHER PUBLICATIONS

Scholl et al, "BDD Minimization Using Symmetries," IEEE, BEB 1999, pp. 81-100.*
School et al., "Minimizing ROBDD Sizes of Incompleteley Specified Boolean Functions by Exploiting Strongly Symmetries," IEEE, 1997, pp. 229-234.*
Jaekel et al., "Recognizing Nonseries-Parallel Structures in Multilevel Logic Minization," IEEE, 1995, pp. 95-101.*

* cited by examiner

*Primary Examiner*—Vuthe Siek
(74) *Attorney, Agent, or Firm*—Allen, Dyer, Doppelt, Milbrath & Gilchrist, P.A.

(57) ABSTRACT

Very complex (multilevel) logical expressions are represented in a vector format. The logic is simplified by identifying opposing couples (a literal and its negation) and replacing symmetrical logic expressions attached to the opposing couples with a single version. Significant simplification of the logic can thus be achieved that is suitable for applications in CAD/CAM and in design and manufacture of integrated circuits. The simplification results in increased reliability, lower cost and faster circuits. Techniques for simplifying circuits with multiple outputs are also described.

13 Claims, 19 Drawing Sheets

Step 3

[p(qr-s ∨ q-r-s)] ∨ p-q-rs ∨ {p[q(r-s ∨ -r-s ∨ -rs)]}

3. Delete the couple, superimpose the symmetries, and delete resulting redundancies. Keep multiple paths (e.g. pq-rs) open.

Step 4

[-p(qr-s ∨ q-r-s)] ∨ p-q-rs ∨ {p[q(r-s ∨ -r-s ∨ -rs]}

Repeat Steps 2 and 3 for the r, -r couple

Results of Step 4

[-p(qr-s ∨ q-r-s)] ∨ p-q-rs ∨ {p[q(r-s ∨ -r-s ∨ -rs]}

Step 5

$[-p(qr-s \lor q-r-s)] \lor p-q-rs \lor \{p[q((r-s \lor -r-s \lor -rs)]\}$

Repeat Steps 2 and 3 for q, -q couple.

Diagram 7

[-p(qr·s ∨ q·r·s)] ∨ p·q·rs ∨ {p[q(r·s ∨ -r·s ∨ -r·s]}

Resulting simplified logical expression is:

S* = q·s ∨ p·rs

Unimproved Circuits T1 and T2

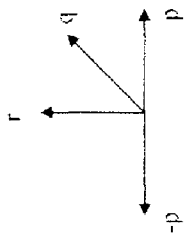
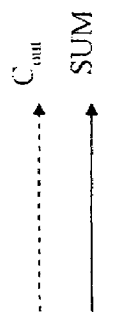
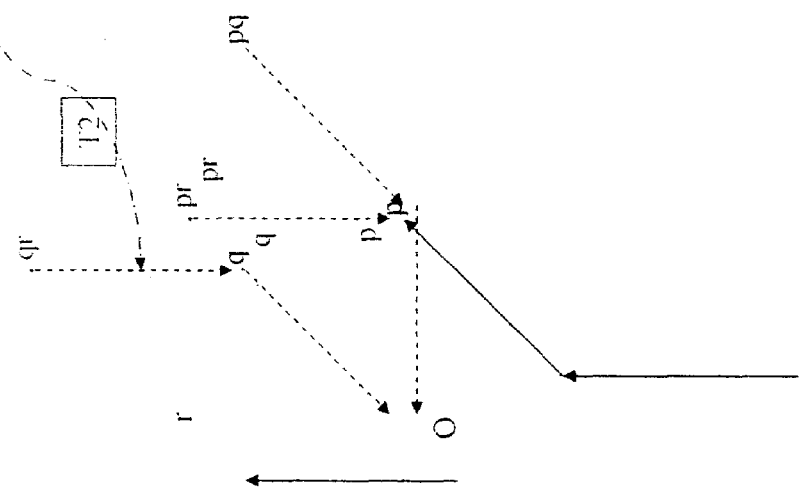
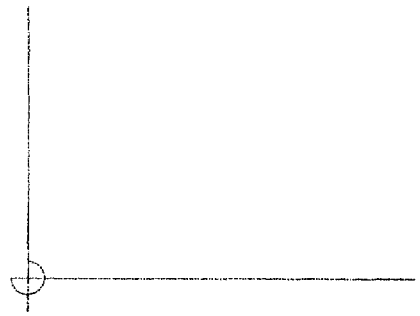
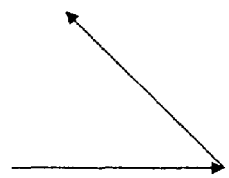
FIGURE 14
pq + qr + pr
and
p xor q xor r

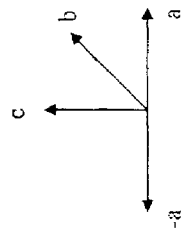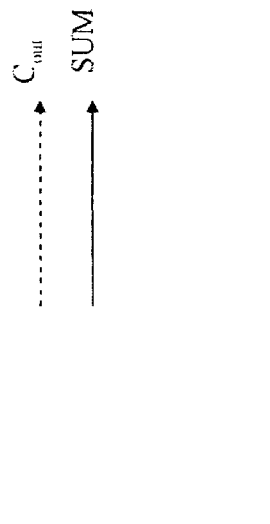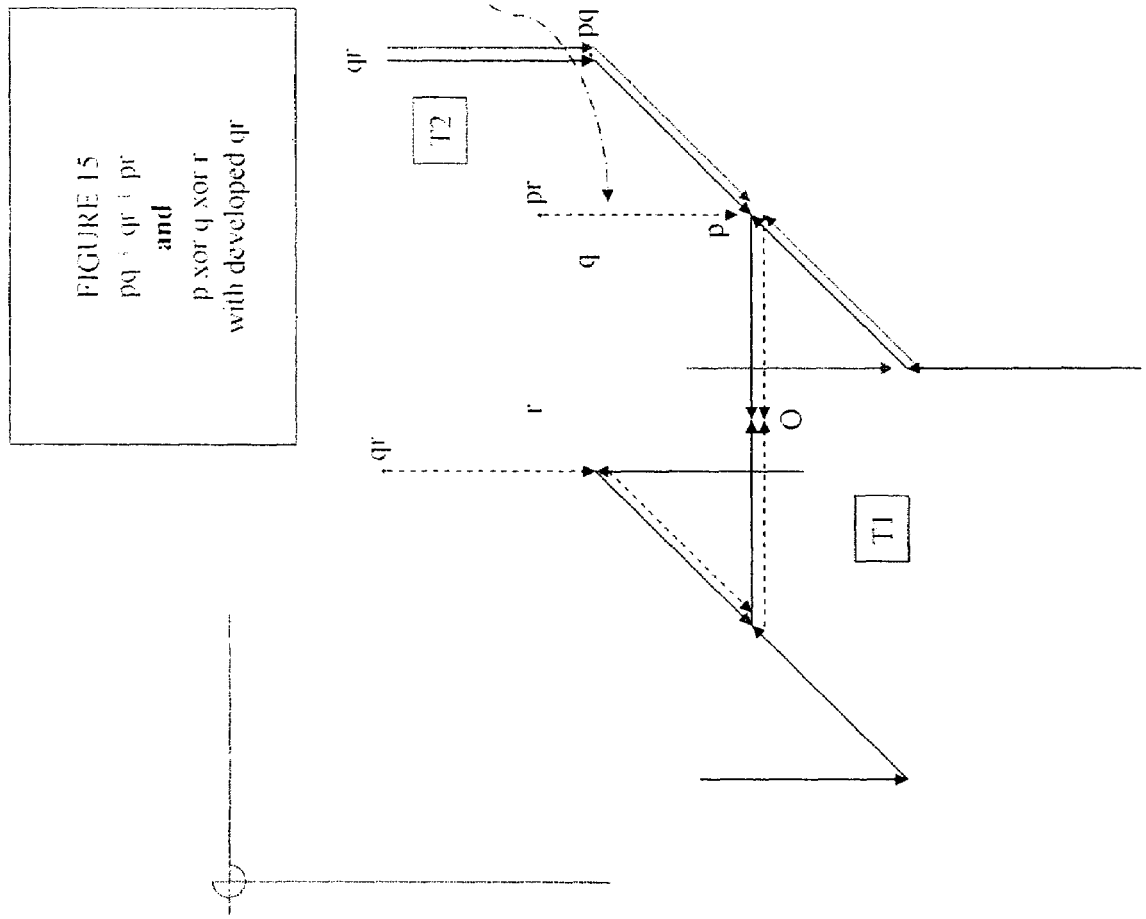
FIGURE 15
pq + qr + pr and
p xor q xor r
with developed qr

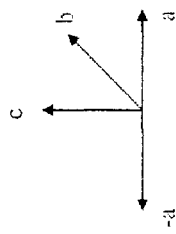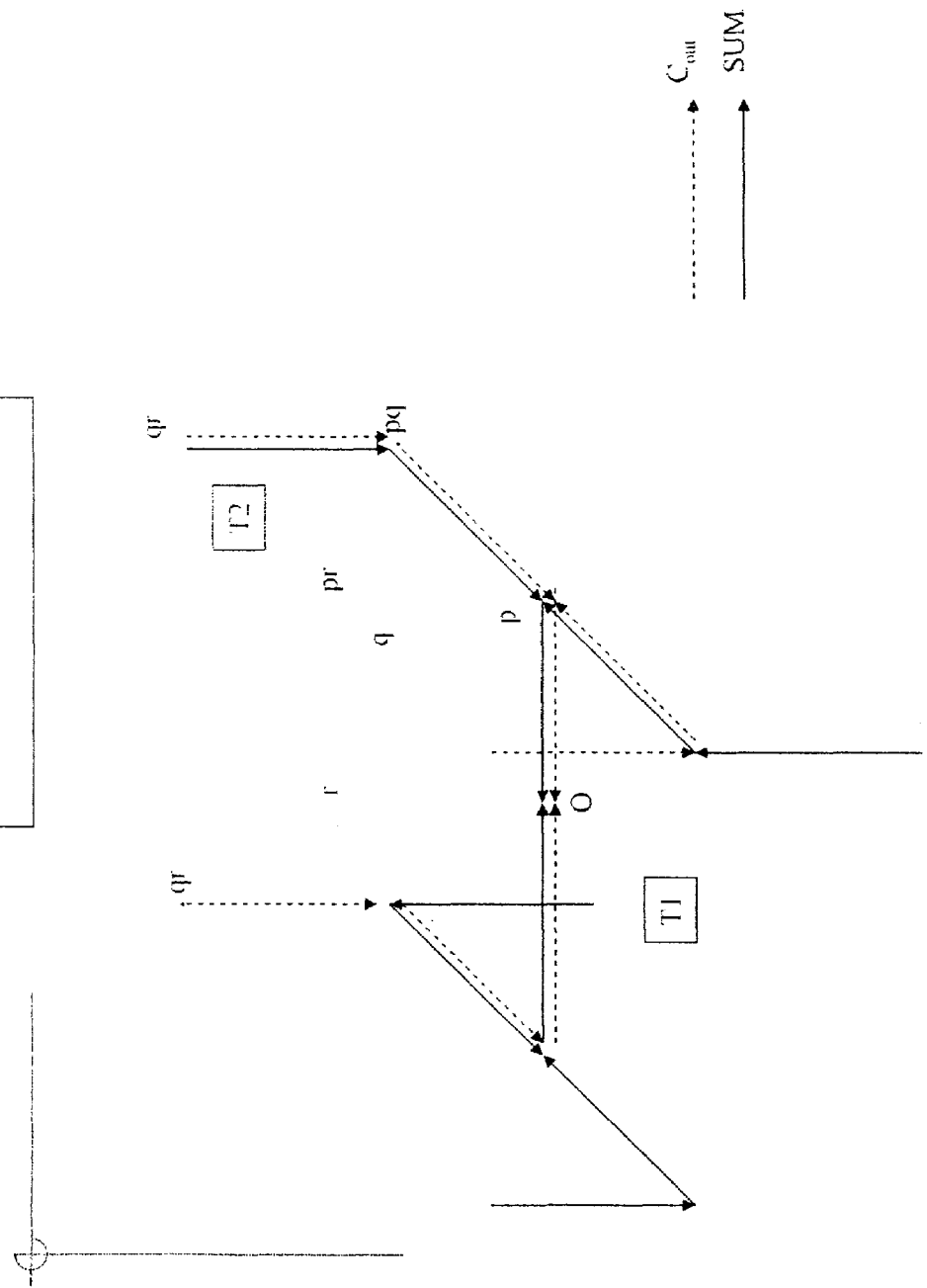
FIGURE 16
pq + qr + pr
and
p xor q xor r
(Solution)

pq : qr + pr
and p xor q xor r
with developed pr.
and redundant r deleted

Improved Circuits T1 and T2

VECTOR LOGIC TECHNIQUES FOR MULTILEVEL MINIMIZATION WITH MULTIPLE OUTPUTS

CROSS REFERENCE TO RELATED APPLICATIONS

This application is a continuation-in-part of U.S. patent application Ser. No. 10/655,766, filed Sep. 5, 2003, by Jonathan Westphal now U.S. Pat. No. 7,174,519.

This application is related to and incorporates by reference in their entirety, the following patent applications:

U.S. Provisional Application No. 60/408,938 filed Sep. 6, 2002,

PCT Application US99/21955 filed Sep. 22, 1999, and published as WO00/17788 on Mar. 30, 2000 by Jonathan Westphal, and PCT Application US01/31217 filed Oct. 5, 2001, and published as WO02/29520 on Apr. 11, 2002 by Jonathan Westphal.

FIELD OF THE INVENTION

This invention relates to the field of minimization of logical circuits, including but not limited to integrated circuits and optical logics, including those having multiple outputs.

DESCRIPTION OF RELATED ART

Minimization of logical circuits has been a long time goal of circuit designers and of those who manufacture integrated circuits. Minimization is important from a cost point of view because fewer circuits reduce the cost of manufacture of a complicated logical array. Minimization is also important from the context of reliability because the more components there are the greater the likelihood that one of them may fail.

Although minimization has been a goal, achieving that goal has been met with limited success. Only the simplest of logic problems have been susceptible to formal simplification techniques. The more complicated logical problems have simply been too difficult to solve.

The more complicated logical problems, called herein multilevel problems, have not been susceptible to any kind of formalized simplification process that would result in a demonstrably correct simplification of the logic to a simpler form. Multilevel logical representations typically involve cross linkage between terms of a logical expression and in the use of brackets and other separators. Until this point in time there has been no generally applicable technique for simplifying multilevel logical circuitry.

SUMMARY OF THE INVENTION

The invention is directed to apparatus, systems, methods, computer program products and other techniques for simplifying logical circuitry and other multilevel minimization problems, and particularly to those having multiple outputs.

BRIEF DESCRIPTION OF THE DRAWINGS

The objects, features and advantages of the system of the present invention will be apparent from the following description in which:

FIGS. 6 and 7 are identical.

FIG. 14 shows development of the superimposed schema of FIG. 13 using qr.

FIG. 15 shows development of the superimposed schema of FIG. 14 using pr.

FIG. 16 shows a simplification of the schema of FIG. 13.

DESCRIPTION OF THE PREFERRED EMBODIMENTS

Figure 1:
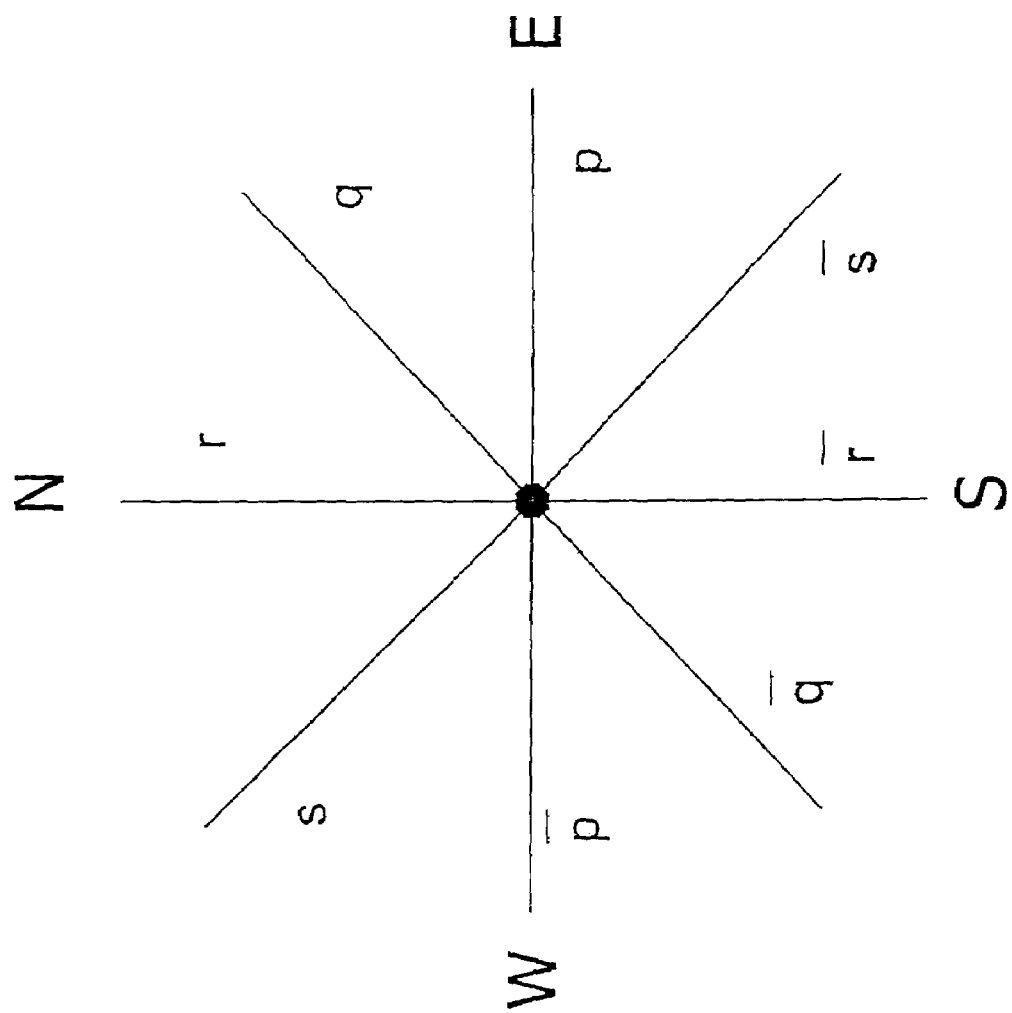
FIG. 1 shows an exemplary set of unit vectors that will be used in vector representation of logical schema.

The following description relates to the solution to an exemplary as opposed to one multilevel logic minimization problem: find the or a shortest equivalent for the schema S.

S: [-p(qr-s v q-r-s)]v p-q-rs v[p(q(r-s v-rs v-r-s))].

Some comments on notation will facilitate the understanding of the invention and the techniques described herein. In the schema listed above, there are four literals, namely p, q, r and s. When represented in text, the dash before a literal indicates the negation of the literal. In other words, "-s" means "not s." Another representation for "not s" is the literal s with an over-score sometimes called "s bar". Since word processing programs don't easily allow for literals to be over-scored, it is easier to represent the "not" state by using a dash before them when typing. However, in the drawings, the over-score will commonly be used in lieu of the dash. In the schema above, the separator "v" represents a disjunction or an alternation. Terms joined by a "v" are related by an "or" function. Literals and expressions that are adjacent to each other are considered to be conjunctions such that both terms or expressions must be true for the overall expression to be true. Conjunction corresponds generally to a logical "AND" function and logical disjunction or alternation corresponds to logical "OR" function.

The methods and techniques disclosed for simplifying the exemplary schema shown above, will allow one skilled in the art to find solutions of the same sort for all other multilevel minimization or simplification problems.

FIG. 1 shows a set of unit vectors that will be used in vector representation of the exemplary logic schema discussed above. There are four literals, namely p, q, r and s. Each of the literals have their respective negations represented by a vector. For example, the literal p is represented by vector in the horizontal plane with an arrowhead pointing toward the origin O. The negation of p is also represented by a vector on the horizontal plane but pointing in the opposite direction toward the origin O. The other literals have similar representations.

When representing the logical schema, described above, these unit vectors will be utilized. In this notation, only four literals are shown, because that is all that is needed for this particular logical schema. However, the set of unit vectors may be increased, as needed depending on the complexity of the problem. In other words, although only four literals are shown, the unit vector approach may be expanded to accommodate any number of literals. Each literal will have a unit vector associated with a direction and the arrowhead of which represents whether the literal or its negation is represented depending on the direction in which the arrowhead points. Disjunctions or alternations are represented by forks in the vector system.

The general multilevel minimization procedure is as follows.

Step one—Represent the multilevel schema or schemata in vector format as shown below.

Step two—Take a or the greatest symmetry (GS) within the system. In the case of the exemplary schema, these would be the expressions offered by p(q)r–s v–r–s)) and (–p)qr–s v q–r–s)), which contain a couple (e.g. p, –p). A literal and its negation when represented in vector notation will sometimes be referred to an opposing couple. The p couple vectors will be eliminated and the two expressions linked by those will be joined at a common point in this case at the origin. This is sometimes referred to as a symmetry slide or SS. This will become more apparent as we discuss this specific example hereinafter.

Step three—Leave any routes which are not part of the symmetry of the selected opposing elements as described hereinafter.

Step four—Repeat these steps with respect to opposing couples of each of the other literals.

Step five—Translate the final equivalent vector representation of the simplified schema into a standard schema in prepositional logic.

Figure 9:
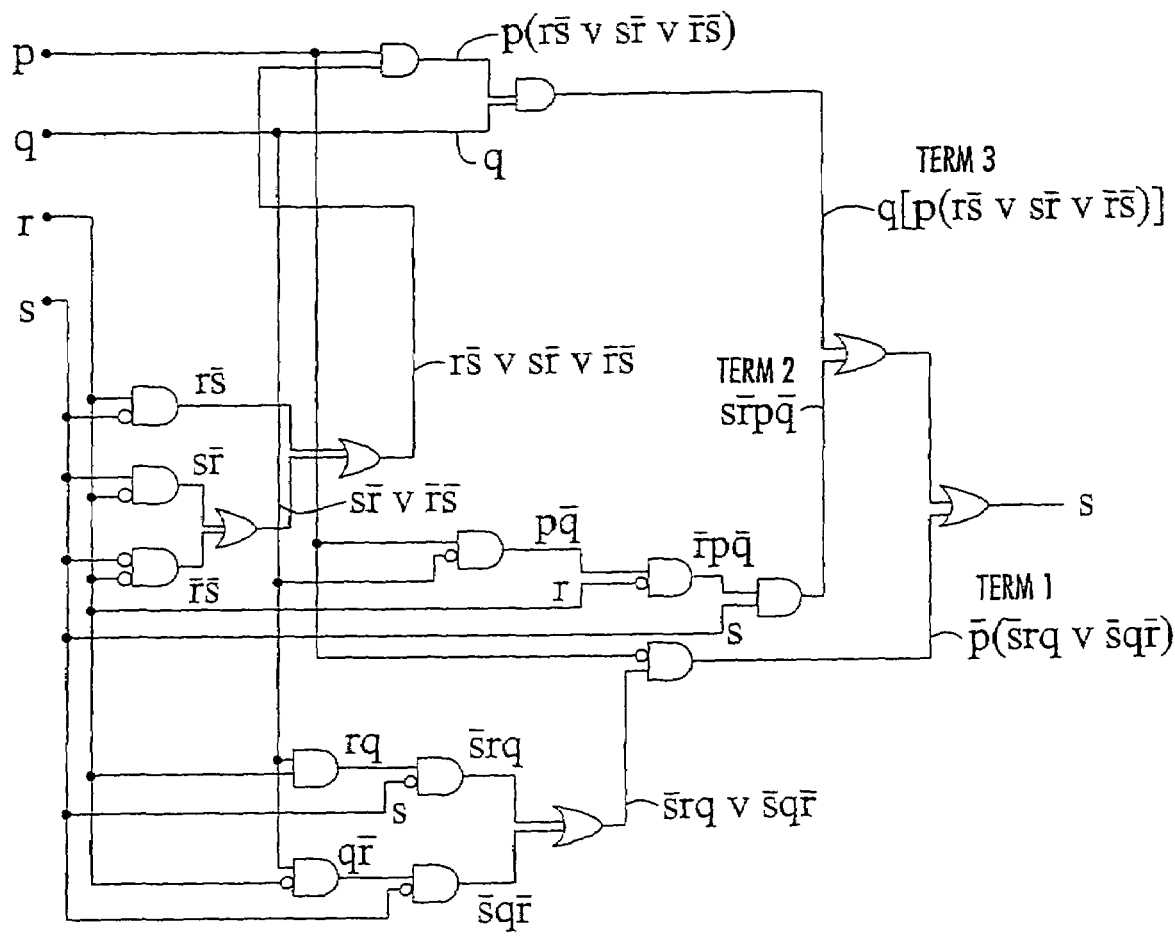
FIG. 9 shows unminimized S in gate or circuit form.

In the example to be described more in detail hereinafter, the original logic implementation of the schema was a circuit with 13 two input and gates, 5 joins (or gates) and 10 inverters The unsimplified implementation is shown in FIG. 9 in circuit form. The simplified form of the schema which results from the techniques described above and to be described in more detail below, is a circuit which has 3 two input and gates, one join (or gate) and two inverters. The latter describes a significantly cheaper, faster and more reliable circuit.

The methods and techniques disclosed for the following example will allow one skilled in the art-to find solutions of the same sort for all other multilevel logic minimization or simplification problems.

As noted above, the invention will be exemplified by simplifying the following schema, as an example:

S: [–p(qr–s v q–r–s)]v p–q–rs v [p(q(r–s v–rs v–r–s))].

The first step involved in minimization in the schema is to represent the schema in a vector notation. This will be done showing line representations of vectors as in FIG. 2 but this can also be done utilizing representation of vectors inside a computer. An origin, O, serves as a reference point for representing the logical schema in vector notation.

Figure 2:
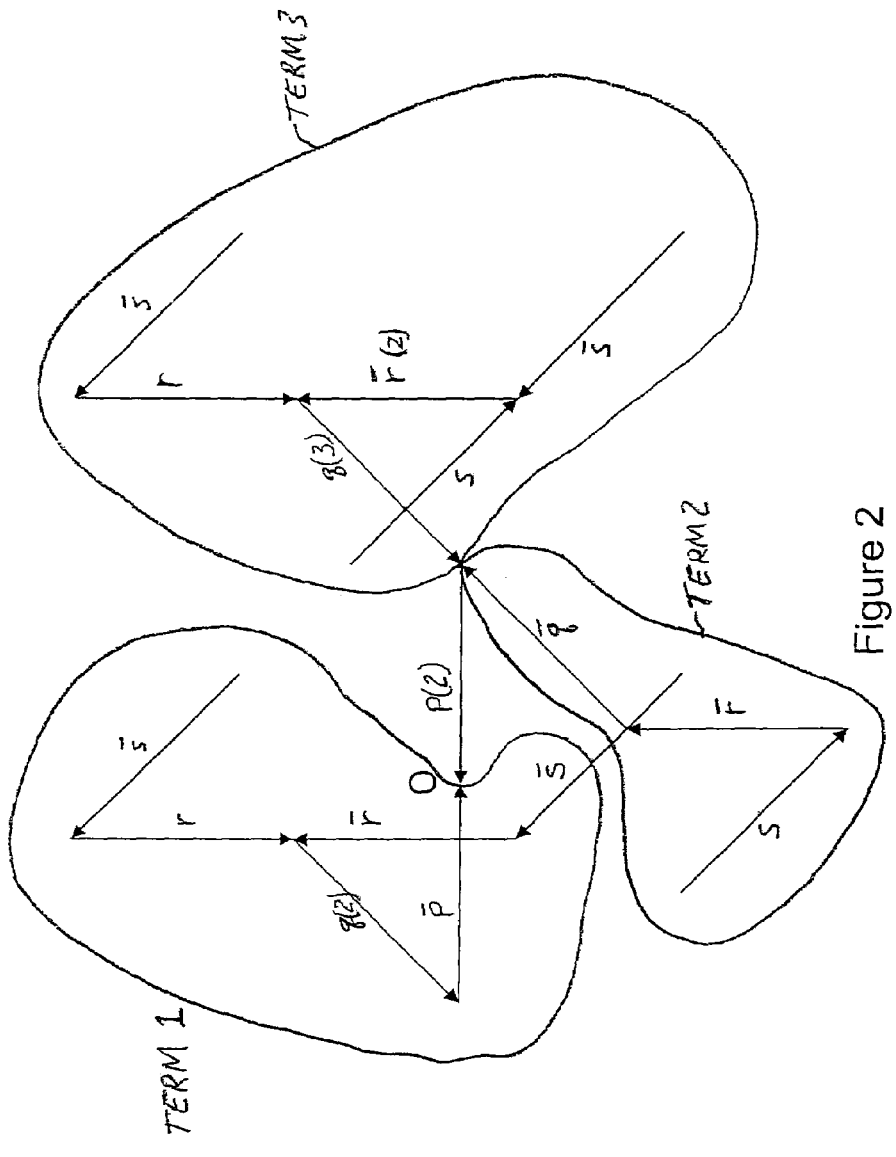
FIG. 2 shows the vector representation of an exemplary logical schema S.

Turning first to the area described as term 1 in FIG. 2, beginning with the origin, the "–p" literal is represented by a horizontal vector pointing into the origin. The conjunction of q with that "–p" vector is illustrated by a q vector attached to the tail of the "–p" vector. At the end of the q vector there are two vectors r and –r. Note that-both of the disjunctions contained within the parenthesis of the first term are q such that the vector q is actually traversed twice and then the paths diverge.

The first term inside the parenthesis of the first term, namely qr–s, branches over the path labeled r and –s, that is vertically above the junction of the q, r and –r vectors. The second portion of the first term also begins with the junction of the q,r and –r vectors and proceeds over the –r vector to the –s vector.

One should note that disjunctions, in this notation, are visually identifiable by forking of vectors off of a junction point. Therefore the disjunction represented by the "v" in the first term of the schema is shown as the separate r and –r paths of the intersection with q. Conjunctions, on the other hand are represented by placing the appropriate vectors head to tail or tail to tail as appropriate. Similarly, terms 2 and 3 of the schema both begin with a p vector. In FIG. 2, the p vector is shown-with a "2" indication adjacent. This implies that there are two traversals of the p vector path one for each of terms2 and 3.

Going to term two, which is p–q–rs, the vector p is followed from the origin to the right the vector –q along the –q vector to the intersection with –r followed by the s vector.

Note that in FIG. 2 that the intersection of the –q and –r vectors on the –s vector is an artifact of the representation and implies no logical relationship. It is merely an incident of the rendition.

Term 3 of the schema also begins by traversing the p vector to the right and follows then the q vector to the disjunction represented by r the junction of q, r and –r vectors in the term three space. The first term within the third term follows the r path to the –s vector. The second term in the third term follows the –r path to the –s vector. The third term follows the –r vector to the s vector. As before, the –r vector is shown with a "2" adjacent to show that the vector is traversed twice in the representational notation.

Once a schema is represented in vector notation as shown in FIG. 2, one can begin the process of simplification. The simplification process is centered about opposing couples such as vectors p and –p.

The question of "symmetry" can best be illustrated with reference again to FIG. 1. FIG. 1 has, in addition to the unit vector representations, a set of compass directions indicated on the drawing. If one were to describe the route to be taken from a physical location on the face of the earth to a destination, one could describe it as a set of directions to be followed. For example one could say: "Drive north one mile then drive east one mile then drive southeast a half a mile and then south for a quarter of a mile to the destination." This is analogous to a logical representation where a portion of the same route is traversed, coming from different beginning points.

Referring again to FIG. 2, one can see that there is similarity in vector representation S between the term that follows the –p vector and those that follow the p vectors. For example, at the end of each p and –p vector there is a vector q which then intersects with vectors r and –r, the r vector of which intersects with a –s and the –r vector of which intersects with the –s. Thus, there is great similarity between the paths followed once the p and –p vectors have been traversed. It is exploiting the symmetry that permits a reduction in the complexity of the logical representations.

Figure 3:
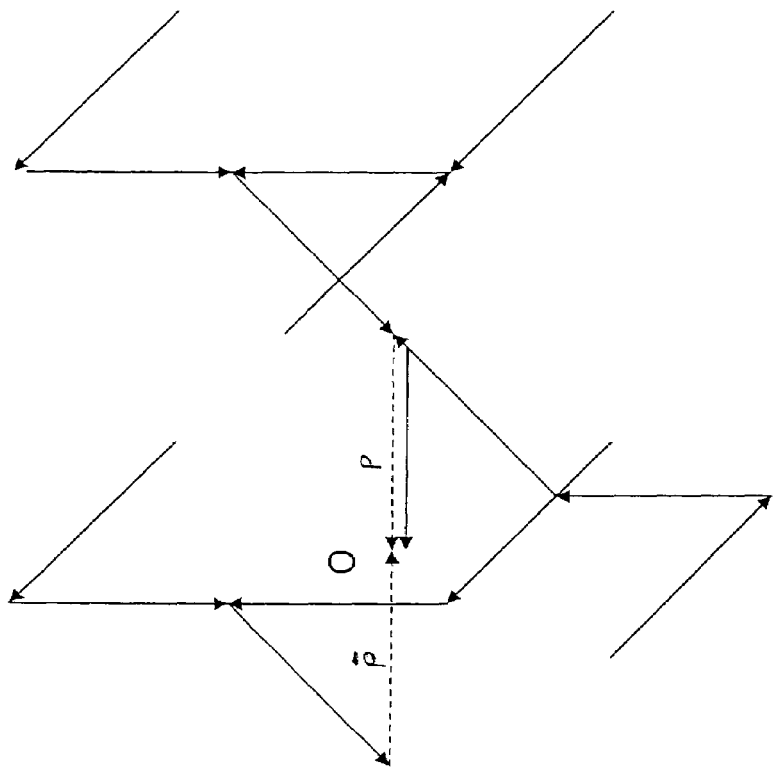
FIG. 3 represents the schema S with a partial minimization achieved by deleting opposed couples on the path of the or a greatest symmetry, in this case for the variable p.
Figure 4:
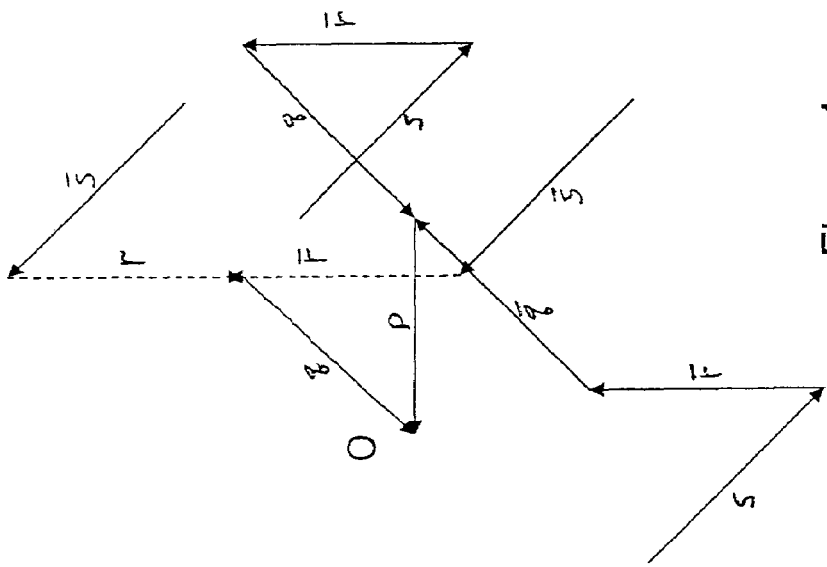
FIG. 4 represents FIG. 3 with redundancies removed.
Figure 5:
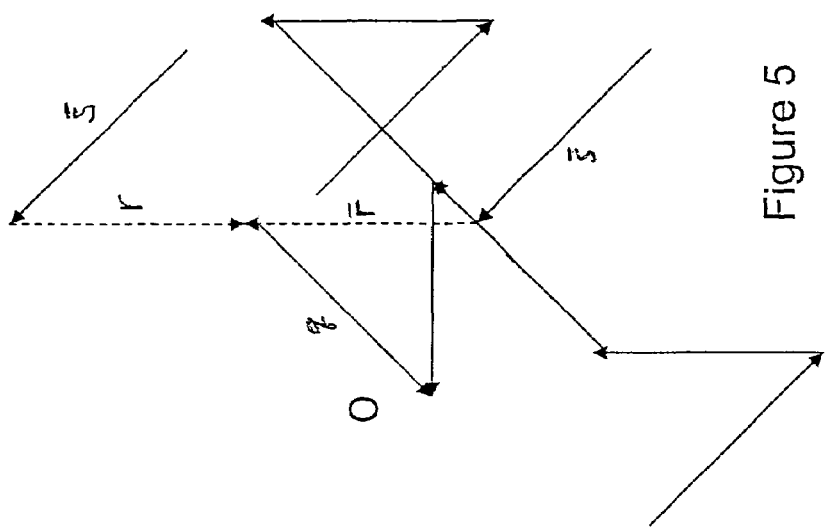
FIG. 5 shows FIG. 4 with the procedures SS, LL and ER described below applied for the variable q.

Returning again to FIG. 3, we focus on the p, –p opposing couple. Our intention is to remove one instance of the p vector and counter balance it against the –p vector in the simplification process. Accordingly, the portion of the vector representation to the right of the p vector that corresponds to the representation to the right of the –p vector will be superimposed; that is the corresponding vector will slide (symmetry slide) over so that they coincide at a single point. In this case, since the –p vector has been "canceled" by one instance of the p vector, the vector branches off of the –p vector will slide so that the q vector points to the origin and similarly, the corresponding symmetrical vectors to the right of the p vector will be slid to the origin so as to coincide with those that come from the removal of the –p vector. The result of the symmetry slide is shown in FIG. 4. Note that the portion of the third term that corresponds to the disjunction –rs does not have a corresponding counterpart in the symmetrical portion of term 1. Accordingly, one instance of the q vector one instance of the –r vector and the s vector do not slide and remain where they are. That is what is meant by the notation above FIG. 4 about keeping multiple paths open.

Figure 6:
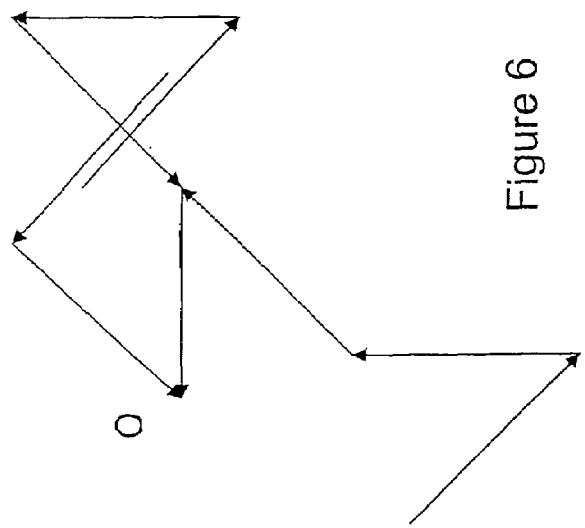
FIG. 6 shows the process described below including SS, LL and ER applied to FIG. 5 for the variable r.

In FIG. 4, the r and the –r vectors are shown in dashed form to indicate that they are the next opposing couple that will be considered for simplification. As shown in FIG. 4, both the r vector and the –r vector intersect a –s vector. The –s vector represents a symmetrical feature that can be simplified. Accordingly, the r and the –r vector are eliminated and the –s vector from both ends slide (symmetry slide) onto the end of the q vector with results in the representation shown in FIG. 6.

Figure 7:
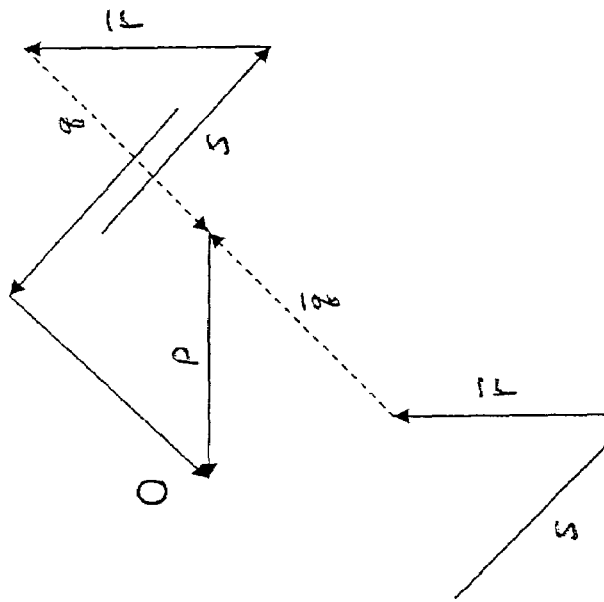
FIG. 7 shows the process described below including SS, LL and ER applied to FIG. 6 for the variable s.
Figure 8:
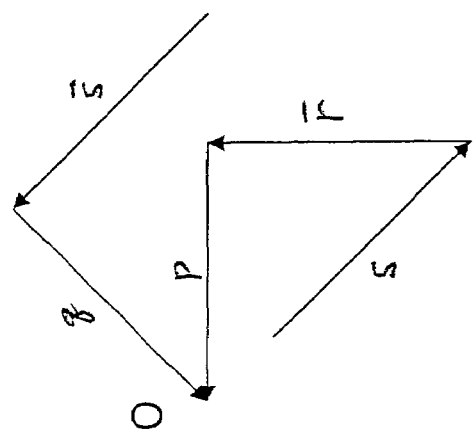
FIG. 8 shows the resulting simplified schema S*.

FIG. 7 shows that we will next focus on the q, –q opposing couple. Again, symmetry is shown in that each of the q and –q vectors terminate in a –r vector connected to an s vector. Again the q and –q vectors are eliminated and the –r and s vectors that are attached to the endpoints thereof slide together to the common point at the end of the p vector. The resulting simplified logical expression is shown in FIG. 8. The simplified schema representation, S*, is as follows.

$$S^* = q-s \lor p-rs.$$

When comparing the original schema S with S*, the degree of simplification is significant.

Figure 10:
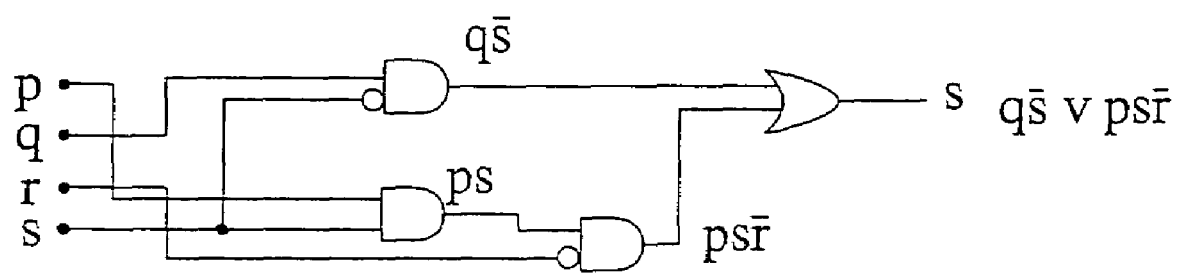
FIG. 10 shows minimized S* in gate circuit form.

FIG. 9 shows a logical circuit which implements the schema S and FIG. 10 shows a logical circuit which implements the simplified schema S*. The degree of simplification is nicely apparent when comparing the two circuits. Implementing schema S as shown requires 13 two input gates 5 or gates and 10 inverters. FIG. 8, on the other hand has 3 two input gates, 1 or gates and 2 inverters. The circuit of FIG. 10 is vastly cheaper, faster and more reliable. It is faster because there are fewer logic decisions that need to be made resulting in a faster response time.

To demonstrate that the logic of the simplified schema S* is logically equivalent to the logic of the original schema S, Appendix A sets forth a truth table constituting a proof that the two circuits are logically identical although one is vastly cheaper, faster and more reliable that the other.

Multilevel minimization or simplification problems are much harder than two-level problems. There exist algorithms which provide satisfactory answers to the latter. Multilevel problems are difficult enough, but with multiple outputs the difficulty is increased. Vector logic techniques can give solutions to the multilevel problems such as the schema S described above.

Figure 11:
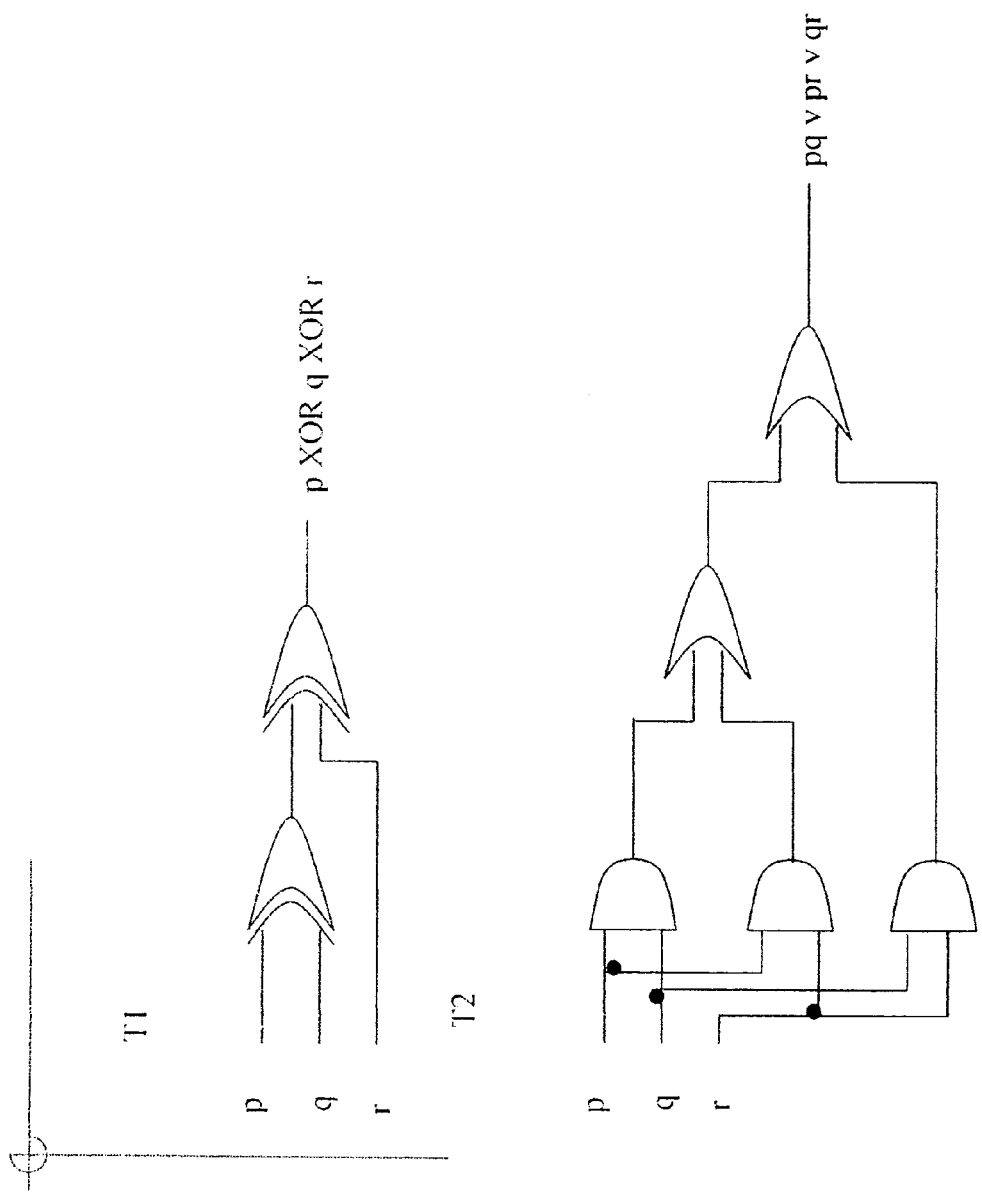
FIG. 11 shows a logic circuit having, p, q, r inputs and a plurality of outputs.
Figure 12:
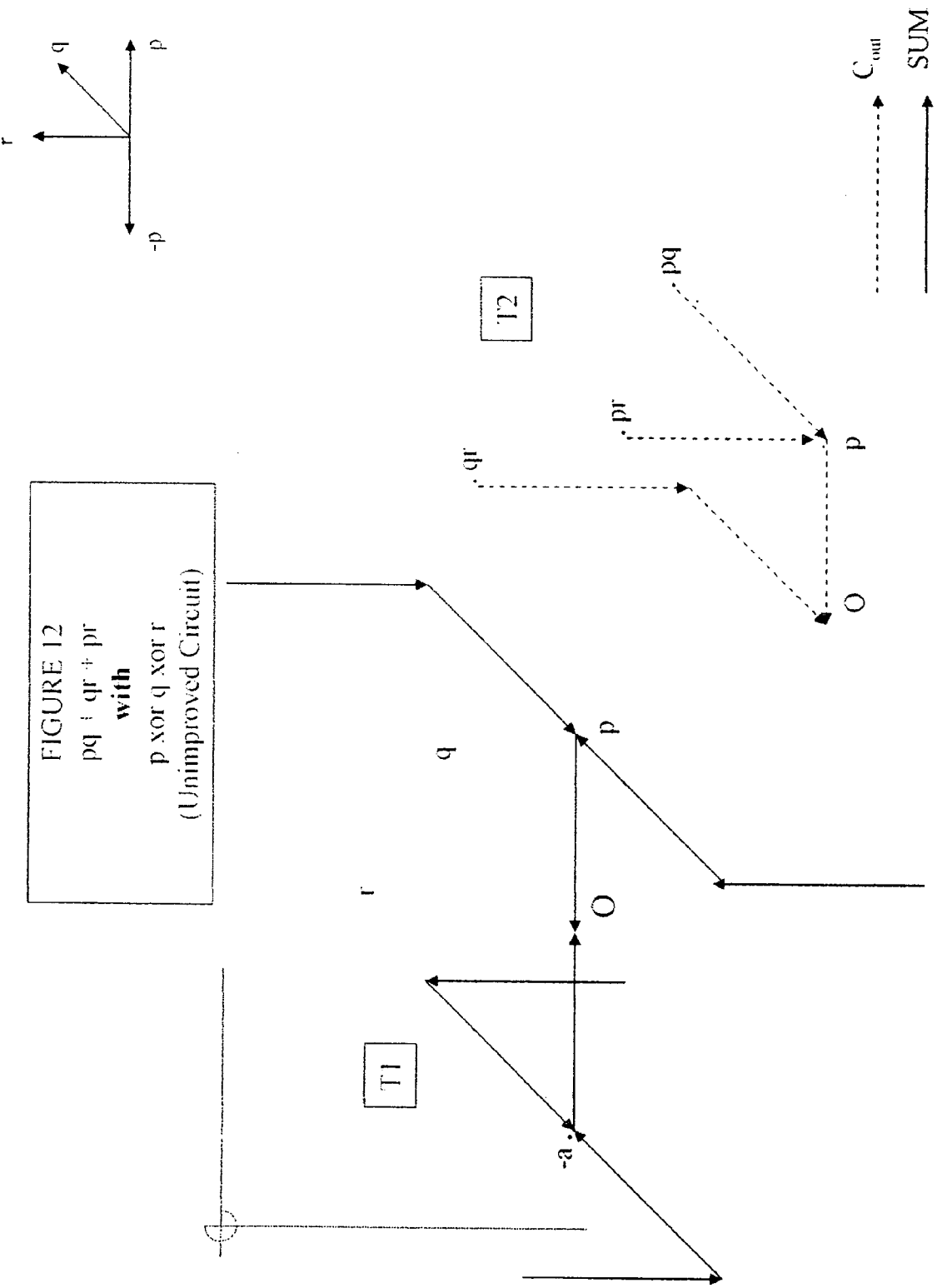
FIG. 12 shows a logical representation of the circuits of FIG. 11 in vector format.

Consider the multilevel multioutput schemata T1 and T2. T1: p XOR q XOR r. T2: pq ∨ pr ∨ qr. These two unimproved circuits are represented in FIG. 11. The vector logic representation is shown in FIG. 12, with T2 shown as dotted vectors. As with single-output circuits such as the one represented by the schema S, there are five steps in the minimization routine.

Figure 13:
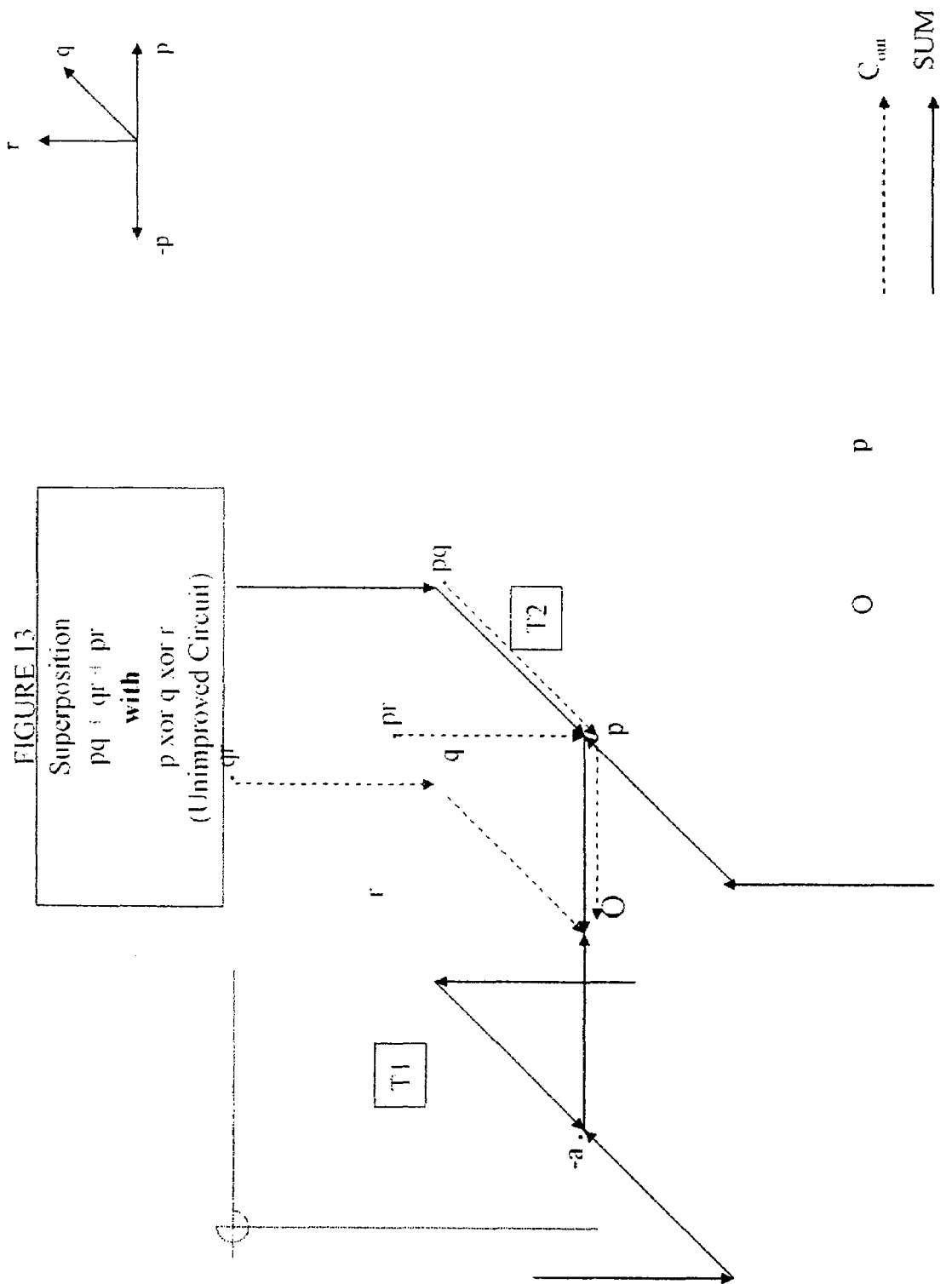
FIG. 13 shows a logical schema of FIG. 12 superimposed.

Step one—Represent the multilevel output schema or schemata in vector logical format. For the multioutput problem the two schema T1 and T2 can be superimposed, as in FIG. 13.

Step two—In multioutput cases a particular circuit may not remain equivalent in performance and output to the unimproved version of the circuit, and yet have the same output in the context of the second output circuit. As with S, we search for couples, and these can be eliminated as before by contracting Symmetry Sliding collapsing opposing couples. In the case of superimposed T1 and T2 there are no symmetrical opposing couples to collapse.

To overcome this problem, one can take qr and create an expanding Symmetry Slide as follows: Step 3—Expand qr about the couple at O, p and –p. This yields the vector system shown in FIG. 14, in which qr has been developed, as logicians say, to normal form pqr ∨–pqr. Step 4—The pqr disjunct is superimposed onto the existing pqr disjunct within p XOR q XOR r, and plays no further role. It can now be replaced by the shorter vector pq. This will represent part of the improved pq ∨ pr ∨ qr output. The result is a local improvement from two alternations of 2 and 2:1 literals, to one disjunct of 2:2 plus two literals, a drop of one literal. Step 5—pr can also be minimized in the same way as shown in FIG. 15. There is a developing Symmetry Slide about the couple q and –q in pqr ∨ p–q–r.

The result is an improvement, as one disjunct of pqr ∨ p–qr is absorbed into pqr. The other is new, and the final output locally is (p–q ∨ –pq)r, or as shown in FIG. 16.

Figure 17:
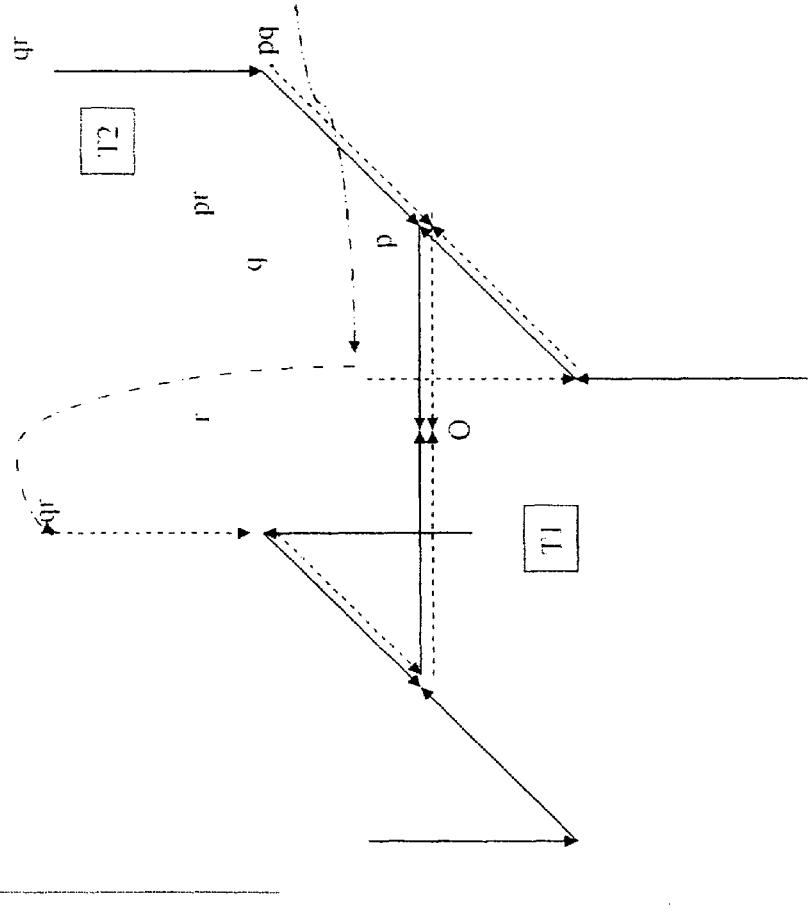
FIG. 17 is used to explain the resulting simplified schema of FIG. 16.
Figure 18:
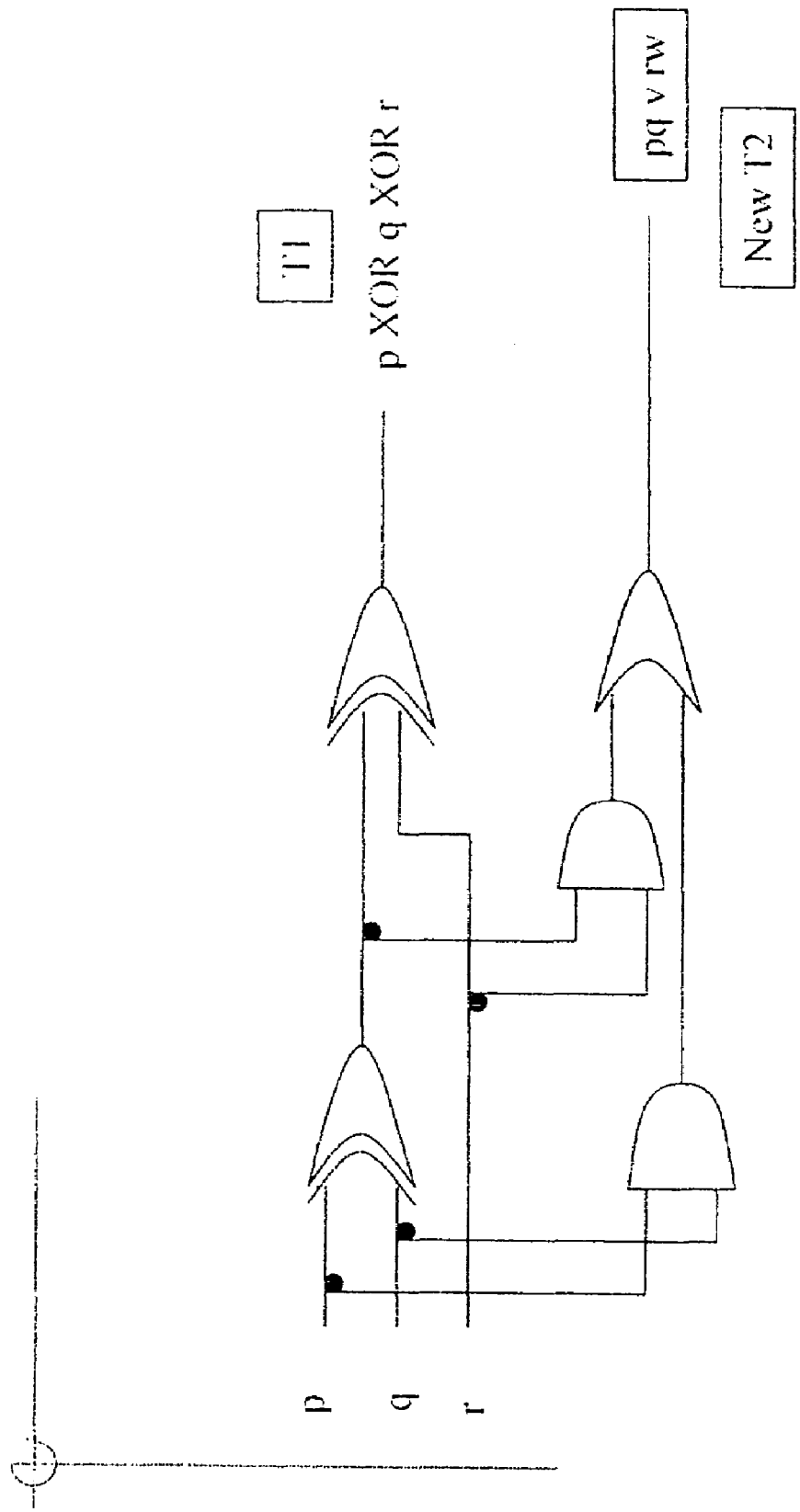
FIG. 18 shows a minimized schema of FIG. 16 in gate circuit form.

Upon inspection the simplified schema shown in FIG. 17 shows that T1 is unchanged, but that T2 is now pq ∨ rw, where w is the wire function p XOR q. The thus simplified multiple output circuit is shown in FIG. 18. This is an improved circuit for a full adder.

Figure 19:
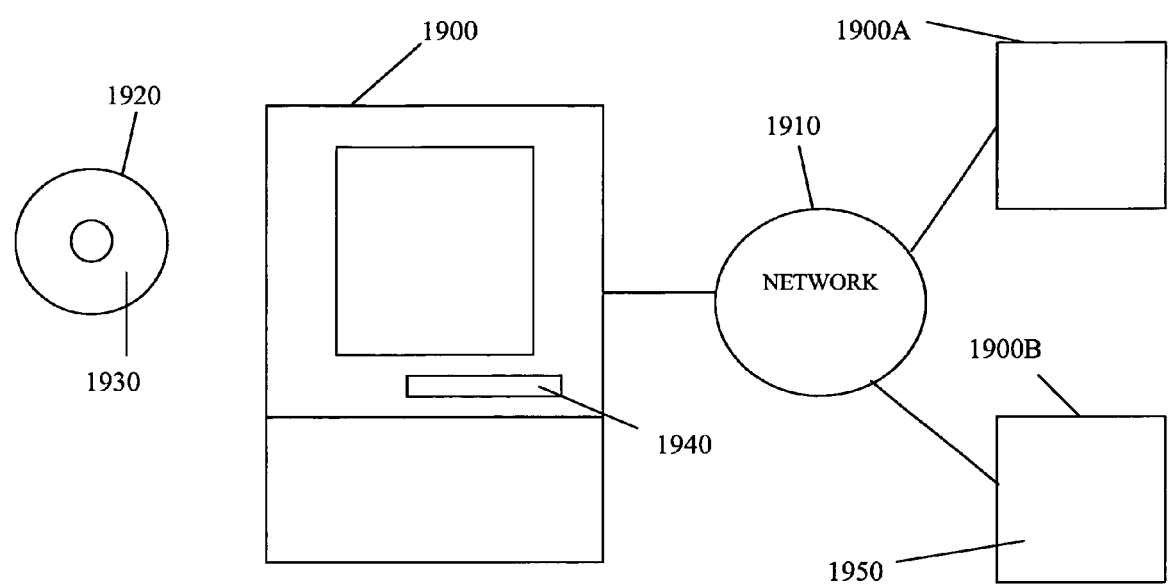
FIG. 19 is a block diagram showing system/apparatus/computer program products as described in the specification and original claims.

FIG. 19 shows a block diagram of system/apparatus/computer program products in accordance with hone aspect of the invention. A computer 1900 has a computer storage medium reader 1940 and is connected to a network 1910. Other computers, 1900A and 1900B are also connected to the network. Computers 1900, 1900A and 1900B can have CAD/CAM programs stored thereon for execution. A computer readable storage medium 1920 is shown which has stored thereon computer readable instructions constituting a computer program. The program is described in the specification above.

Accordingly, applicants have demonstrated techniques that are well suited for simplification of logic circuitries particularly those of the multilevel nature. Applicants have demonstrated techniques for minimizing logic circuitry which are suitable for implementation in CAD CAM programs for the design in implementation of logical circuits. The techniques described herein can be implemented routinely in software operating in such devices or in general purpose computers. The use of these techniques will permit vast simplification in the production design in manufacture of logical circuits, including integrated circuits.

Although the invention has been described herein with respect to a specific example, numerous extensions and applications of the techniques described herein will be apparent to one skilled in the art. The invention is not limited to the description herein but rather is reflected in the claims below.

APPENDIX A

Input Data

| P | Q | R | S | NOT P | NOT Q | NOT R | NOT S |
|---|---|---|---|-------|-------|-------|-------|
| FALSE | FALSE | FALSE | FALSE | TRUE | TRUE | TRUE | TRUE |
| FALSE | FALSE | FALSE | TRUE | TRUE | TRUE | TRUE | FALSE |
| FALSE | FALSE | TRUE | FALSE | TRUE | TRUE | FALSE | TRUE |
| FALSE | FALSE | TRUE | TRUE | TRUE | TRUE | FALSE | FALSE |
| FALSE | TRUE | FALSE | FALSE | TRUE | FALSE | TRUE | TRUE |
| FALSE | TRUE | FALSE | TRUE | TRUE | FALSE | TRUE | FALSE |
| FALSE | TRUE | TRUE | FALSE | TRUE | FALSE | FALSE | TRUE |
| FALSE | TRUE | TRUE | TRUE | TRUE | FALSE | FALSE | FALSE |
| TRUE | FALSE | FALSE | FALSE | FALSE | TRUE | TRUE | TRUE |
| TRUE | FALSE | FALSE | TRUE | FALSE | TRUE | TRUE | FALSE |
| TRUE | FALSE | TRUE | FALSE | FALSE | TRUE | FALSE | TRUE |
| TRUE | FALSE | TRUE | TRUE | FALSE | TRUE | FALSE | FALSE |
| TRUE | TRUE | FALSE | FALSE | FALSE | FALSE | TRUE | TRUE |
| TRUE | TRUE | FALSE | TRUE | FALSE | FALSE | TRUE | FALSE |
| TRUE | TRUE | TRUE | FALSE | FALSE | FALSE | FALSE | TRUE |
| TRUE | TRUE | TRUE | TRUE | FALSE | FALSE | FALSE | FALSE |

Term 1 — Second Term

| R and not S | Not R and S | Not R and Not S | Disjunctive of first three | Q and Disjunctive | Results of first term P and previous column | Results of Second Term and not Q and not R and not S |
|---|---|---|---|---|---|---|
| FALSE | FALSE | TRUE | TRUE | FALSE | FALSE | FALSE |
| FALSE | TRUE | FALSE | TRUE | FALSE | FALSE | FALSE |
| TRUE | FALSE | FALSE | TRUE | FALSE | FALSE | FALSE |
| FALSE | FALSE | FALSE | FALSE | FALSE | FALSE | FALSE |
| FALSE | FALSE | TRUE | TRUE | TRUE | FALSE | FALSE |
| FALSE | TRUE | FALSE | TRUE | TRUE | FALSE | FALSE |
| TRUE | FALSE | FALSE | TRUE | TRUE | FALSE | FALSE |
| FALSE | FALSE | FALSE | FALSE | FALSE | FALSE | FALSE |
| FALSE | FALSE | TRUE | TRUE | FALSE | FALSE | TRUE |
| FALSE | TRUE | FALSE | TRUE | FALSE | FALSE | FALSE |
| TRUE | FALSE | FALSE | TRUE | FALSE | FALSE | FALSE |
| FALSE | FALSE | FALSE | FALSE | FALSE | FALSE | FALSE |
| FALSE | FALSE | TRUE | TRUE | TRUE | TRUE | FALSE |
| FALSE | TRUE | FALSE | TRUE | TRUE | TRUE | FALSE |
| TRUE | FALSE | FALSE | TRUE | TRUE | TRUE | FALSE |
| FALSE | FALSE | FALSE | FALSE | FALSE | FALSE | FALSE |

Term 3

| Q and R and not S | Q and not R and not S | Disjunctive of first two | Results of Third Term Not P and Disjunctive |
|---|---|---|---|
| FALSE | FALSE | FALSE | FALSE |
| FALSE | FALSE | FALSE | FALSE |
| FALSE | FALSE | FALSE | FALSE |
| FALSE | FALSE | FALSE | FALSE |
| FALSE | TRUE | TRUE | TRUE |
| FALSE | FALSE | FALSE | FALSE |
| TRUE | FALSE | TRUE | TRUE |
| FALSE | FALSE | FALSE | FALSE |
| FALSE | FALSE | FALSE | FALSE |
| FALSE | FALSE | FALSE | FALSE |
| FALSE | FALSE | FALSE | FALSE |
| FALSE | FALSE | FALSE | FALSE |
| FALSE | TRUE | TRUE | FALSE |
| FALSE | FALSE | FALSE | FALSE |
| TRUE | FALSE | TRUE | FALSE |
| FALSE | FALSE | FALSE | FALSE |

Combined Terms Constituting the Schema

| Term 1 | Term 2 | Term 3 | Schema Results Disjunctive of all three terms |
|---|---|---|---|
| FALSE | FALSE | FALSE | FALSE |
| FALSE | FALSE | FALSE | FALSE |
| FALSE | FALSE | FALSE | FALSE |
| FALSE | FALSE | FALSE | FALSE |

APPENDIX A-continued

| | | | |
|---|---|---|---|
| FALSE | FALSE | TRUE | TRUE |
| FALSE | FALSE | FALSE | FALSE |
| FALSE | FALSE | TRUE | TRUE |
| FALSE | FALSE | FALSE | FALSE |
| FALSE | TRUE | FALSE | TRUE |
| FALSE | FALSE | FALSE | FALSE |
| FALSE | FALSE | FALSE | FALSE |
| FALSE | FALSE | FALSE | FALSE |
| TRUE | FALSE | FALSE | TRUE |
| TRUE | FALSE | FALSE | TRUE |
| TRUE | FALSE | FALSE | TRUE |
| FALSE | FALSE | FALSE | FALSE |

Simplified Equivalent Circuit

| Q and not S | P and S | P and S and not R | Output of Simplified Logic Disjunctive of first and third terms | Output of Full Logic | Output of Simplified Logic |
|---|---|---|---|---|---|
| FALSE | FALSE | FALSE | FALSE | FALSE | FALSE |
| FALSE | FALSE | FALSE | FALSE | FALSE | FALSE |
| FALSE | FALSE | FALSE | FALSE | FALSE | FALSE |
| FALSE | FALSE | FALSE | FALSE | FALSE | FALSE |
| TRUE | FALSE | FALSE | TRUE | TRUE | TRUE |
| FALSE | FALSE | FALSE | FALSE | FALSE | FALSE |
| TRUE | FALSE | FALSE | TRUE | TRUE | TRUE |
| FALSE | FALSE | FALSE | FALSE | FALSE | FALSE |
| FALSE | FALSE | FALSE | FALSE | TRUE | FALSE |
| FALSE | TRUE | TRUE | TRUE | FALSE | TRUE |
| FALSE | FALSE | FALSE | FALSE | FALSE | FALSE |
| FALSE | TRUE | FALSE | FALSE | FALSE | FALSE |
| TRUE | FALSE | FALSE | TRUE | TRUE | TRUE |
| FALSE | TRUE | TRUE | TRUE | TRUE | TRUE |
| TRUE | FALSE | FALSE | TRUE | TRUE | TRUE |
| FALSE | TRUE | FALSE | FALSE | FALSE | FALSE |

APPENDIX B

The truth-tables for the schemata S and S* exhibit the same profile of 1 and 0 as outputs, and are therefore logically equivalent.

| pq rs | S: [-p(qr-s) v q-r-s) v p-q-rs v [p(q(r-s v -rs v -r-s))] | S*: q-s v p-rs |
|---|---|---|
| 1111 | 0 | 0 |
| 1110 | 1 | 1 |
| 1101 | 1 | 1 |
| 1100 | 1 | 1 |
| 1011 | 0 | 0 |
| 1010 | 0 | 0 |
| 1001 | 1 | 1 |
| 1000 | 0 | 0 |
| 0111 | 0 | 0 |
| 0110 | 1 | |
| 0101 | 0 | 0 |
| 0100 | 1 | 1 |
| 0011 | 0 | 0 |
| 0010 | 0 | 0 |
| 0001 | 0 | 0 |
| 0000 | 0 | 0 |

What is claimed is:

1. Apparatus for the design of logic circuits, comprising:
   a. a computer, and
   b. software stored on the computer for
      b1. representing multilevel logic schema having multiple outputs in vector form and for
      b2. simplifing multilevel logic schema into a simplified form by exploiting symmetries in the logical schema.

2. The apparatus of claim 1 in which simplifying multilevel logic schema comprises expanding the multilevel logic schema to create symmetrical opposing couples by developing an expression to a normal form.

3. Apparatus of claim 2 in which simplifying multilevel logic schema comprises eliminating opposing couples.

4. A method of reducing multilevel logic to simpler form comprising the steps of:
   a. representing logic having multiple outputs in vector form;
   b. creating symmetrical opposing couples by developing an expression to a normal form; and
   c. removing redundancy by eliminating opposing couples.

5. The method of claim 4 further comprising the step of:
c. sliding symmetrical portions of the logic attached to opposing couples of the developed expression onto a point common to the opposing couples.

6. The system of claim 5 in which a computer having said software communicates logical schema to one or more other computing devices.

7. The system of claim 5 in which the software eliminates opposing couples in simplifying multilevel logic.

8. A system for the design or manufacturing of logical circuits, comprising:
a. a plurality of computers connected to a network;
b. at least one of said computers having software stored thereof for
  b1. representing multilevel logic schema having multiple outputs in vector form; and for
  b2. simplifying multilevel logic schema into a simplified form by exploiting symmetries in a logical schema.

9. A computer program product, comprising:
a. a computer readable storage medium; and
b. at least one computer program stored on said storage medium, said at least one computer program comprising instructions for:
  b1. representing multilevel logic schema having multiple outputs in vector form; and for
  b2. simplifying multilevel logic schema into a simplified form by exploiting symmetries in the logical schema.

10. A computer program product, comprising:
a. a computer readable storage medium; and
b. at least one computer program stored on said storage medium, said at least one computer program comprising instructions for:
  b1. representing multi-output logic in vector form; and
  b2. removing redundancy by eliminating opposing couples.

11. A method of manufacturing integrated circuits comprising the steps of:
a. representing at least a portion of the logic circuits to be incorporated into the integrated circuit having multiple outputs in vector form; and
b. simplifying the logic by removing redundancy by eliminating opposing couples.

12. A method of manufacturing integrated circuits comprising the steps of:
a. representing at least a portion of the logic circuits to be incorporated into the integrated circuit in vector form, the circuits having multiple outputs; and
b. simplifing the logic by removing redundancy by exploiting symmetries in the logical schema.

13. A method of reducing multilevel logic to simpler form comprising the steps of:
a. representing the logic in vector form, the logic having multiple outputs;
b. identifying opposing couples having at least symmetrical logic comprising some similarities in logical expression that connects to them;
c. removing redundancy by eliminating an opposing couples and sliding the symmetrical logic attached to opposing couples onto a point common to the opposing couples.

* * * * *